United States Patent [19]
Chang

[11] Patent Number: 5,943,272
[45] Date of Patent: Aug. 24, 1999

[54] CIRCUIT FOR SENSING MEMORY HAVING A PLURALITY OF THRESHOLD VOLTAGES

[75] Inventor: Seung-Ho Chang, Cheongju, Rep. of Korea

[73] Assignee: LG Semicon Co., Ltd., Cheongju, Rep. of Korea

[21] Appl. No.: 09/124,915

[22] Filed: Jul. 30, 1998

[30] Foreign Application Priority Data

Jan. 16, 1998 [KR] Rep. of Korea .......................... 98-1140

[51] Int. Cl.$^6$ .................................................. G11C 13/00
[52] U.S. Cl. ............... 365/189.09; 365/184; 365/189.07; 365/230.06; 327/56; 327/74; 327/77
[58] Field of Search ......................... 365/189.07, 189.09, 365/230.06, 184; 327/74, 75, 76, 77, 51, 56

[56] References Cited

U.S. PATENT DOCUMENTS

| | | | |
|---|---|---|---|
| 4,964,079 | 10/1990 | Devin | 365/168 |
| 5,163,021 | 11/1992 | Mehrotra et al. | 365/185 |
| 5,841,704 | 11/1998 | Notom | 365/189.09 |
| 5,847,597 | 12/1998 | Ooishs et al. | 365/189.09 X |

*Primary Examiner*—Do Hyun Yoo
*Attorney, Agent, or Firm*—Fleshner & Kim

[57] ABSTRACT

The circuit for sensing a memory having a plurality of threshold voltages is directed to using a technique for maintaining a characteristic curve of a voltages-matched circuit and combining a characteristic curve in which the voltage is moved by a minimum value which is one half of the reference voltage with a conventional characteristic curve, so that it is possible to reduce in half the minimum distance between the voltage distributions for thereby optimizing the above distance by controlling the power voltage irrespective of the characteristic of a device.

19 Claims, 5 Drawing Sheets

CIRCUIT FOR SENSING MEMORY HAVING A PLURALITY OF THRESHOLD VOLTAGES

BACKGROUND OF THE INVENTION

1. Field of the Invention

The present invention relates to a circuit for sensing a memory having a plurality of threshold voltages and a method therefor, and in particular to an improved circuit for sensing a memory having a plurality of threshold voltages and a method therefor which are capable of accurately sensing a memory by reducing a distance between a threshold voltage distribution width and a distribution width of a memory having a plurality of threshold voltages and being well adapted to reading a data from a memory or sensing the same at a lower voltage.

2. Description of the Background Art

In a programmable memory which is programmed or erased to have a plurality of threshold voltage levels, each threshold voltage level has a predetermined distribution by a process characteristic variation, an operational accuracy of a programming circuit, a temperature variation, etc. Therefore, reducing the width of the distribution and increasing the distance between the distributions are important factors for enhancing the reliability of a sensing operation.

As shown in FIG. 1, the known circuit for sensing a memory having a plurality of threshold voltages includes a first PMOS transistor PM1 the source of which receives a supply power voltage VDD the gate of which is connected with the drain of the same and the memory, and comparators COM1, COM2, and COM3 having first input terminals commonly connected with the drain of the first PMOS transistor PM1 and second input terminals receiving first, second and third reference voltages Vref1, Vref2 and Vref3, respectively.

In the thusly constituted circuit, a plurality of reference voltages or reference voltages are used for sensing the states corresponding to a predetermined threshold voltage distribution, and the threshold voltage distribution ΔVth formed due to various external causes such as a process characteristic variation, an accuracy of a reference voltage, a temperature variation, etc. is directly used. Therefore, when the number of threshold voltages is increased and the voltage applied to the sensing circuit becomes a low level voltage, it is impossible to perform a sensing operation.

In order to overcome the above problems, as shown in FIG. 2, a circuit which is capable of sensing a memory having a plurality of threshold voltages is disclosed, which includes a current mirror 20 one terminal of which is connected with a memory 10, a voltage-matched circuit 30 an output terminal of which is connected with another terminal of the current mirror 20, a comparator 40 one terminal of which is commonly connected with the current mirror 20 and the voltage-matched circuit 30 and another terminal of which receives a reference voltage from a reference voltage distributor 60 for thereby comparing the thusly received two inputs, and a decoding logic circuit 50 for decoding an output signal from the comparator 40.

Here, the current mirror 20 includes a first PMOS transistor PM21 and a second PMOS transistor PM22 wherein the sources of which are connected with each other and receive the supply voltage VDD and the gates of which are connected with each other and then connected with the memory 10, and the drain of the first PMOS transistor PM21 is connected with the voltage-matched circuit 30.

As shown in FIG. 3, the voltage-matched circuit 30 includes a first NMOS transistor NM31 the drain of which receives a reference current voltage IREF, the source of which is connected with a ground voltage VSS, the gate and drain of which are commonly connected, NMOS transistors NM32 through NM35 the gates of which are commonly connected with the gate of the first NMOS transistor NM31 and the drains of which are connected with a ground voltage VSS, an NMOS transistor NM36 the gate of which is connected with the voltage VOUT, an NMOS transistor NM37 the gate of which is connected with the source of the NMOS transistor NM36 and the drain is connected with the voltage VOUT, and an NMOS transistor NM38 the gate of which is connected with the source of the NMOS transistor NM37, and the drain of which is commonly connected with the drains of the NMOS transistors NM36 and NM37 and the voltage VOUT.

The operation of the known circuit for sensing a memory having a plurality of threshold voltages will be explained with reference to the accompanying drawings.

The quantization threshold voltage is generated by adapting an uncertainty of the threshold voltage of the memory and the threshold voltage distribution based on a quantization technique, so that a reading and writing operation is implemented based on the thusly generated voltage value.

As shown in FIG. 4, the voltage quantization technique is implemented by matching one-to-one a plurality of voltage distributions having a predetermined width and distance with the quantized voltage.

FIG. 4C illustrates a step shape function between an input terminal current and an output terminal current of a circuit which perform a voltage quantization function.

Here, assuming that the hatched region of the current distribution corresponds with the cell current corresponding with the threshold voltage distribution of the memory, the above current distribution is biased in the region in which each signal resistance value is small. If the resistance value is very small, an one-to-one mapping operation is performed with respect to the quantized voltages V0, V1 and V3.

Therefore, it is possible to obtain an output signal having a predetermined distribution irrespective of the original threshold voltage distribution using a circuit having the above-described curve characteristic.

When the inclination of each step is increased, the distribution of the threshold voltage which is mapped is narrowed.

In order to implement a mapping current voltage having the characteristic of a step shape function, a current flow is blocked at a predetermined voltage level interval, and when the voltage levels at both ends exceed a predetermined level, the current flow is repeatedly performed.

As shown in FIG. 3, the voltage-matched circuit 30 is a circuit for quantizing a voltage distribution of a memory having four threshold voltage distributions and includes one current mirror and three cascode current sources. Here, it is assumed that the sizes of all transistors are identical.

An output voltage V0 that the second NMOS transistor NM32 forming a current mirror outputs is a saturated voltage Vsat, and the voltage by which the current paths of the NMOS transistors NM33 and NM36 forming a first cascode current power is a threshold voltage of a sixth NMOS transistor NM36, and the voltage V1 by which the first cascode current power is saturated is the value which is obtained by adding the saturated voltage Vsat to the reference voltage Vref. The voltage V2 by which the second cascode current power is saturated is a value which is obtained by adding the saturated voltage 2Vsat (doubled) to the reference voltage Vref, and the voltage V3 by which the third cascode current power is saturated is a value which is obtained by adding the saturated voltage 3Vsat (tripled) to the reference voltage Vref.

Therefore, as shown in FIG. 4C, in the graph of the output current with respect to the mapped threshold voltage, a step shape is obtained based on a voltage quantizing function in which the current is sharply increased.

Here, since it is possible to form a predetermined step shape by controlling the reference current Iref, the reference voltage Vref and the sizes of each transistor, the distance between the voltage distributions and the distribution of the threshold voltage (current) are controlled.

The output signal having a threshold voltage distribution of a memory determined by the characteristic of a step shape function as illustrated in FIG. 4 is inputted into the comparator 40 and is compared with reference voltages Vref1, Vref2 and Vref3 outputted from the reference voltage distributor, so that the states of the output signals become recognizable.

Here, since the reference voltages Vref1, Vref2 and Vref3 are determined by the characteristic of the threshold voltage mapped irrespective of the threshold voltage distribution characteristic of the cell, it is possible to implement a desired characteristic of the voltages.

Here, each reference voltage is determined based on the following equations.

Vref1=(V0+V1)/2

Vref2=(V1+V2)/2

Vref3=(V2+V3)/2

Assuming that there are an n-number of states, an (n−1) number of reference voltages is needed. The output signal values X1, X2 and X3 outputted from the comparator 40 are outputted as digital values MSB and LSB through the decoding logic circuit 50.

As described above, in the known circuit for sensing a memory having a plurality of threshold voltages, when the states of the memory are increased, the distance between the distributions is decreased and the width of the distribution is widened, so that the reliability of the sensing operation is decreased, and the number of states stored in one memory is limited.

The above-described voltage mapping current power has four states. If the states are increased or decreased, the number of branches may be increased or decreased.

However, in the known sensing circuit using a voltage-matched circuit, since the distance between the distributions of the threshold voltages is limited by the threshold voltage of each transistor which is a minimum value of the reference voltage, it is difficult to sense the distributions and distances of more than four threshold voltages at an external voltage of 3.3V.

SUMMARY OF THE INVENTION

Accordingly, it is an object of the present invention to provide a circuit for sensing a memory cell having a plurality of threshold voltages and a method therefor which overcome the aforementioned problems encountered in the background art.

It is another object of the present invention to provide a circuit for sensing a memory cell having a plurality of threshold voltages and a method therefor which are capable of sensing a plurality of threshold voltages by reducing the widths and distances of the distributions of the threshold voltages and accurately sensing the threshold voltages at a low voltage.

To achieve the above objects, there is provided a circuit for sensing a memory cell having a plurality of threshold voltages which includes a current mirror having a first electrode coupled for receiving a first voltage, and a second electrode for coupling to the memory, a combined first voltage-matched circuit having a first electrode coupled to the current mirror and a second electrode coupled for receiving a second voltage, a second voltage-matched circuit having a first electrode coupled to the current mirror and a second electrode coupled for receiving a third voltage, wherein the first, second and third voltages are different voltages, a comparator circuit for comparing a voltage at a node commonly connected with the current mirror and the first and second voltage-matched circuits with a reference voltage and a decoding logic circuit for decoding an output signal from the comparator circuit and outputting a decoded signal.

Also, to achieve at least the above objects in whole or in part, there is provided a memory sensing device, including a current mirror coupled for receiving an input from a memory, a plurality of voltage-matched circuits coupled for receiving a reference current from the current mirror, a logic circuit coupled for receiving an output from the plurality of voltage-matched circuits, and a reference voltage distributor for generating reference voltages.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
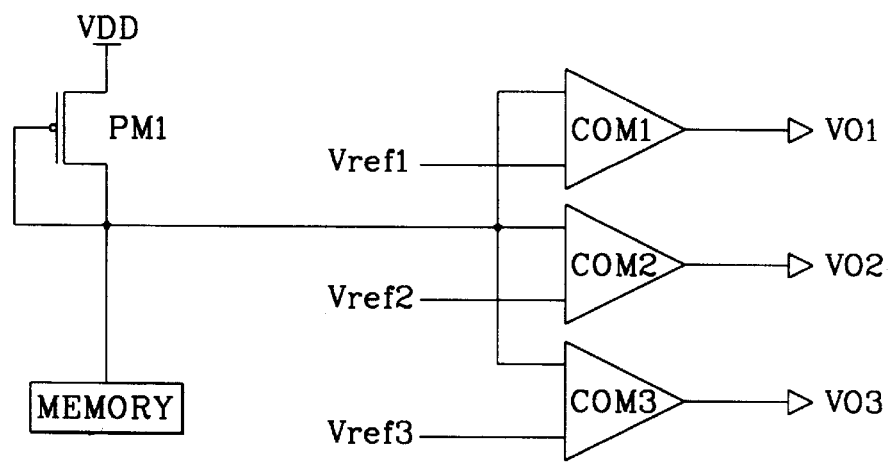
FIG. 1 is a circuit diagram illustrating a known circuit for sensing a memory.
Figure 2:
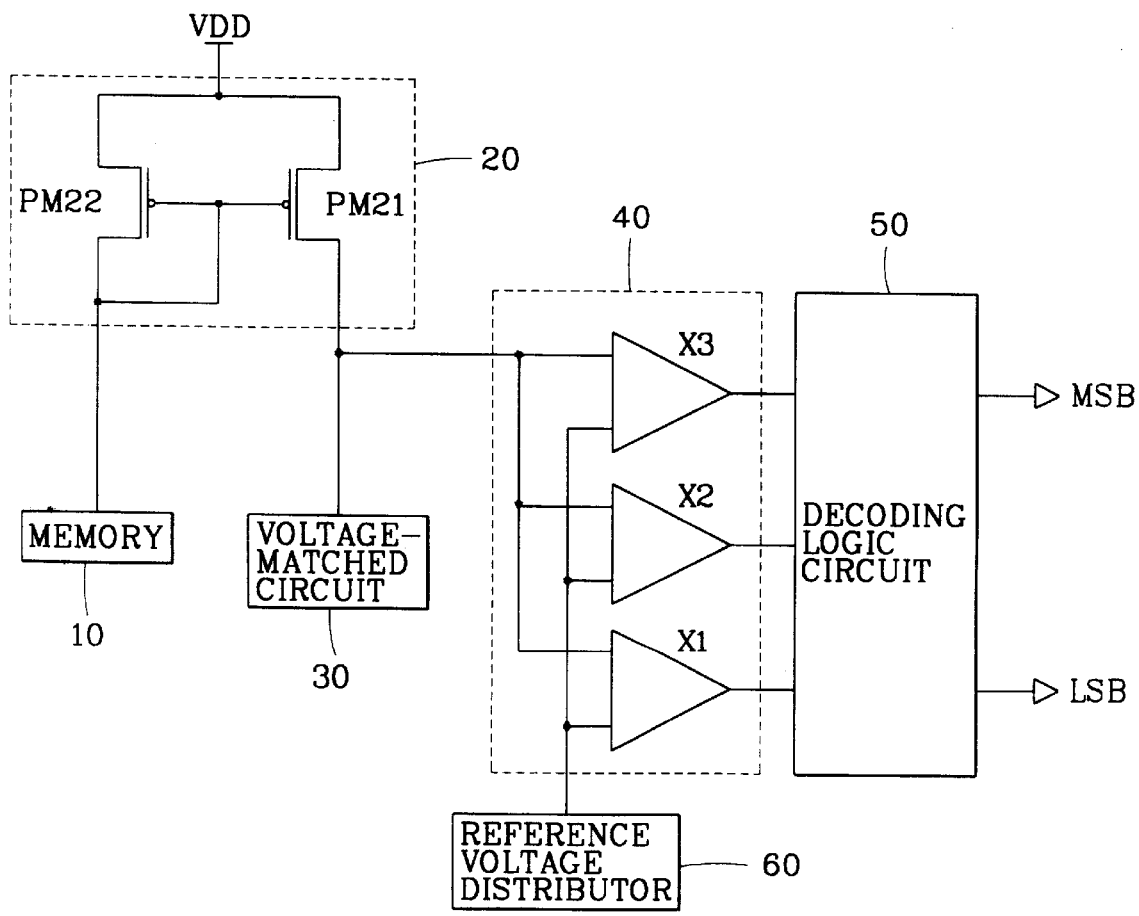
FIG. 2 is a circuit diagram illustrating a known circuit for sensing a memory having a plurality of threshold voltages using a voltage-matched circuit.
Figure 3:
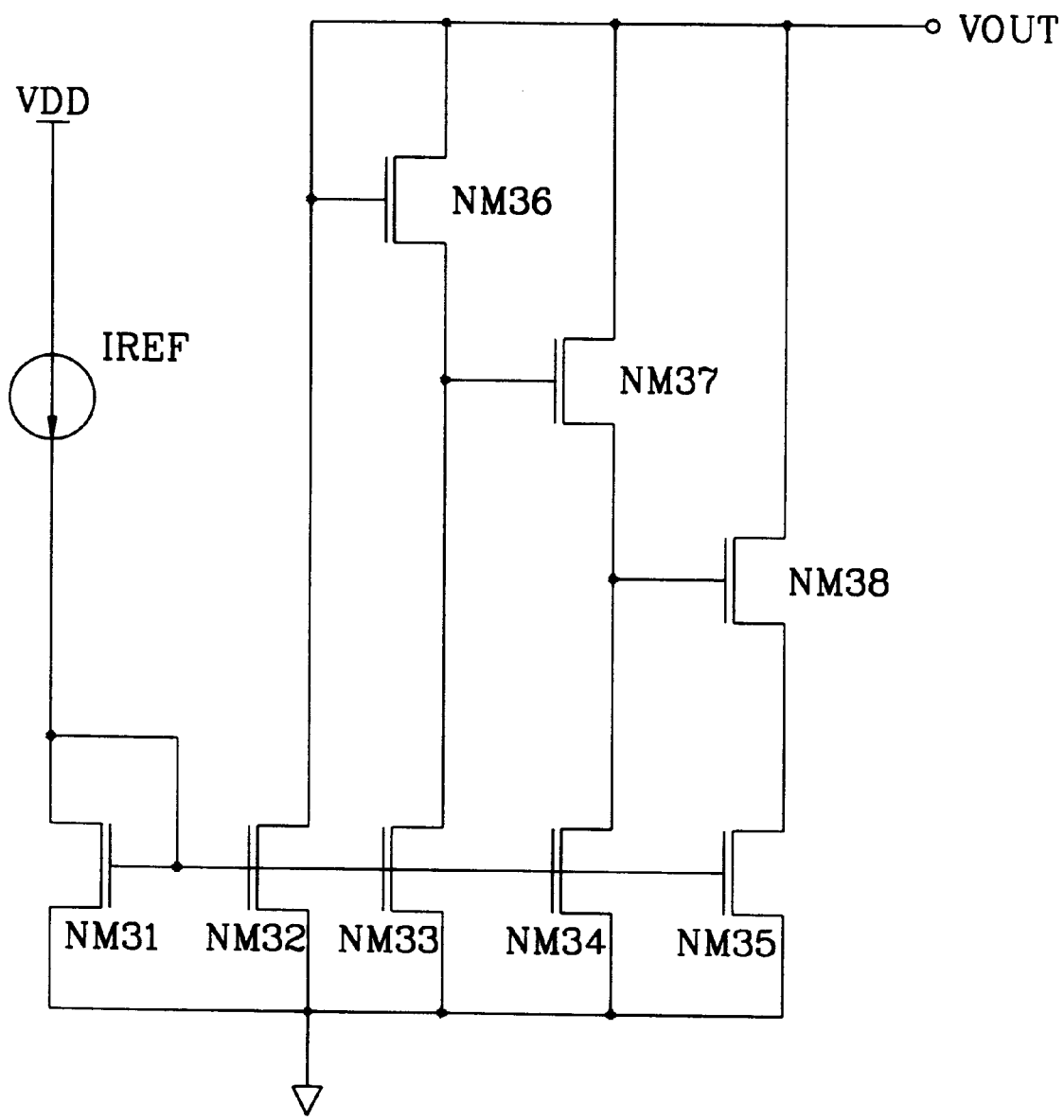
FIG. 3 is a circuit diagram illustrating a voltage-matched circuit of FIG. 2.
Figure 4A:
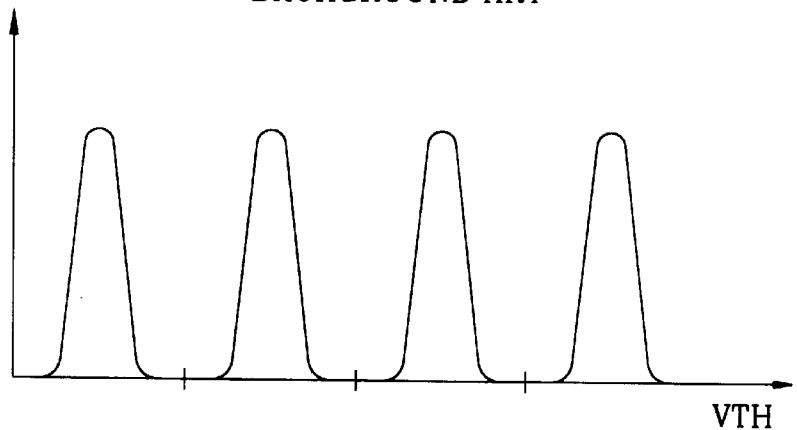
FIG. 4A is a view illustrating a threshold voltage distribution of a memory.
Figure 4B:
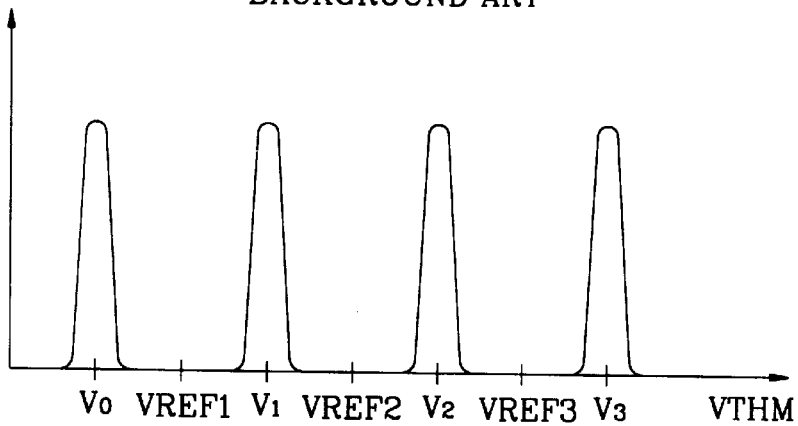
FIG. 4B is a view illustrating a threshold voltage distribution voltage of a voltage-matched memory according to FIG. 4A.
Figure 4C:
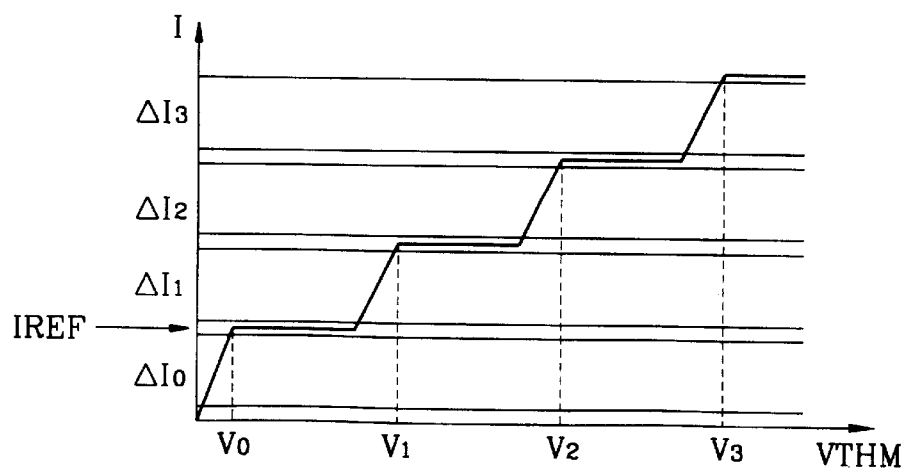
FIG. 4C is a view illustrating a characteristic of a voltage-matched circuit according to FIG. 4B.
Figure 5:
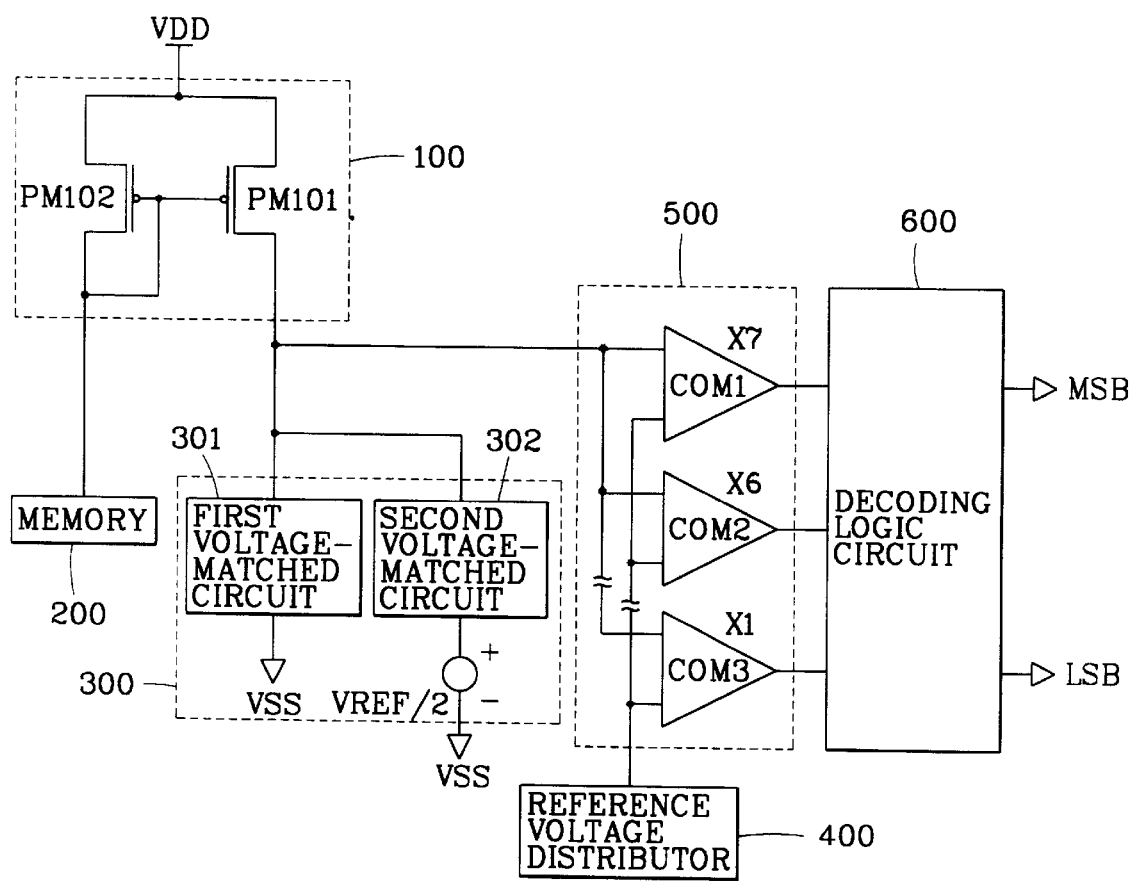
FIG. 5 is a block diagram illustrating a circuit for sensing a memory having a plurality of threshold voltages according to the present invention.

As shown in FIG. 5, the circuit for sensing a memory having a plurality of threshold voltages and a method therefor according to the present invention will now be explained.

First, the circuit for sensing a memory having a plurality of threshold voltages according to the present invention includes a non-volatile memory 200 having a plurality of threshold voltage distributions and a plurality of memory cells for storing a plurality of memory states therein, a current mirror 100 for transferring a current flowing in a bit line of the selected memory cell, a combined voltage-matched circuit 300 commonly connecting two voltage-matched circuits 301 and 302, a reference voltage distributor 400 for outputting a reference voltage having an intermediate value of a voltage distribution generated by the combined voltage-matched circuit 300, a comparator 500, one terminal of which receives an output signal from the combined voltage-matched circuit 300 and another terminal of which receives an output signal from the reference voltage distributor 400, having more than one voltage comparator, and a decoding logic circuit 600 for decoding an output signal from the comparator 500 and outputting digital values LSB and MSB.

The combined voltage-matched circuit 300 includes a first voltage-matched circuit 301 for changing the distribution of a current based on the distribution of a threshold voltage of the selected memory cell to be a voltage distribution narrower than the distribution of the threshold voltage and changing the distance of the distributions, and a second voltage-matched circuit 302 having the same construction as the first voltage-matched circuit and connected with a power voltage for applying a ½ voltage of the distance of the voltage distribution instead of a connection to the ground.

The operation of the sensing circuit according to the present invention will now be explained with reference to the accompanying drawings.

There are provided a cell for connecting a voltage Vds between the drain and the source of the cell, and a voltage clamping circuit between the cell for a sensing operation and a voltage mapping current voltage. The sensing operation is implemented based on a mirroring operation, so that it is possible to enhance the reliability of the sensing operation by increasing a voltage swing of a mirrored branch.

The reference voltages Vref0 through Vref7 from the comparator 500 are determined by the characteristic of the mapped threshold voltage irrespective of the threshold voltage distribution of the memory, so that the intermediate value of the quantization voltage is used for thereby implementing an accurate operation, and the power supply such as an external power voltage VDD is voltage-driven, so that it is possible to minimize the sensing error which occurs because the mapped threshold voltage and reference voltage are affected by a predetermined process, a temperature variation, etc.

When using the current comparator, the reference voltage is changed with the reference current.

The combined voltage-matched circuit 300 uses a power voltage having a voltage of ½ of the reference voltage Vref which is one half of the reference voltage Vref for reducing, in half, the distance of the voltage distribution of the voltage-matched circuit having a predetermined voltage-matched characteristic curve. Therefore, it is possible to implement a narrower voltage distribution and a proper distance of the voltage distribution without changing the basic characteristic of the memory.

The comparator 500 compares a voltage from the combined voltage-matched circuit 300 with a reference voltage.

The output signals from the comparator 500 may be expressed as digital values LSB and MSB using the decoding logic circuit 600.

Figure 6A:
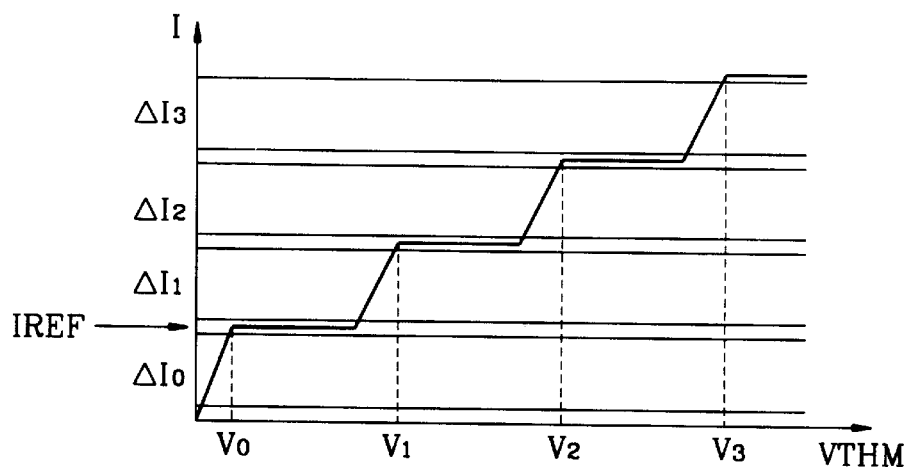
FIG. 6A is a graph illustrating a characteristic of a first voltage-matched circuit of FIG. 5.
Figure 6B:
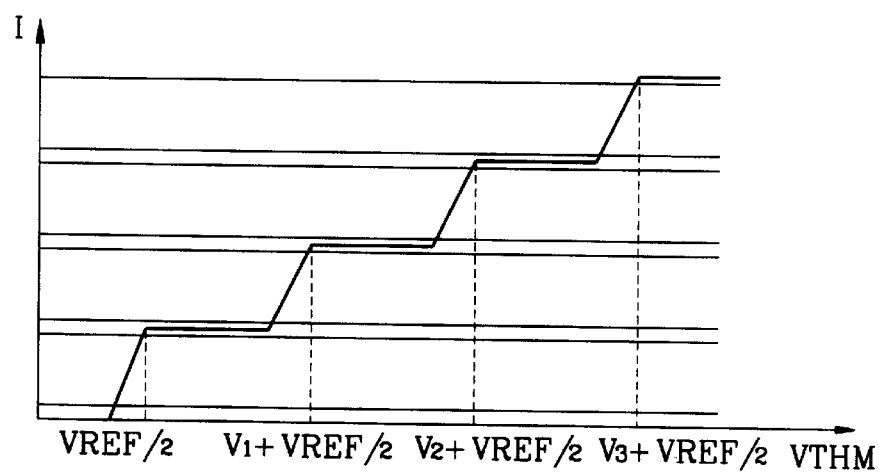
FIG. 6B is a graph illustrating a characteristic of a second voltage-matched circuit of FIG. 5.
Figure 6C:
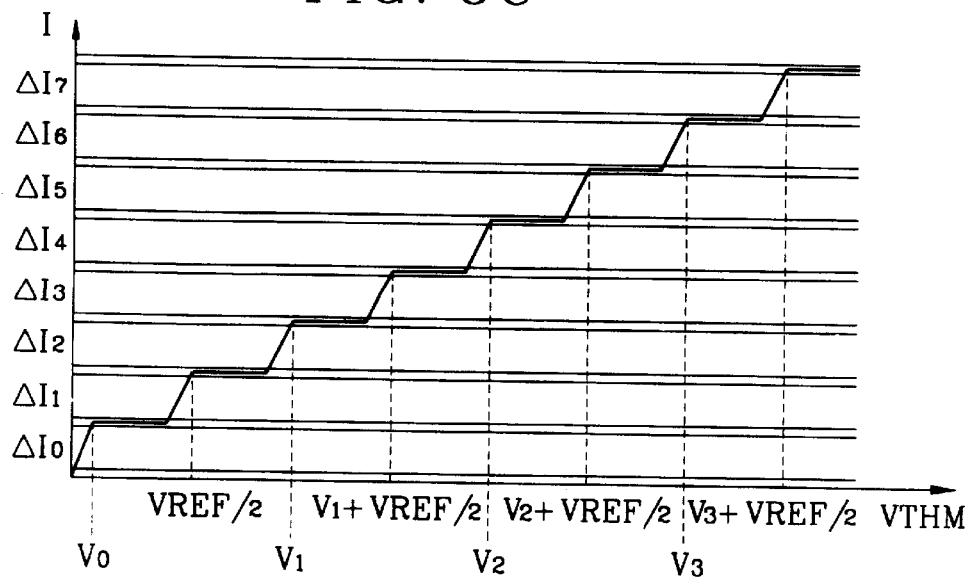
FIG. 6C is a graph illustrating a characteristic of a combined voltage-matched circuit of FIG. 5.

As shown in FIG. 6, in the present invention, it is possible to implement a narrow voltage distribution and a predetermined distance between the voltage distributions without changing the characteristic of the memory using the combined voltage-matched circuit 300.

As described above, in the present invention, it is possible to implement an accurate sensing operation for a memory cell having a plurality of threshold voltages at a low voltage without changing the characteristic of a memory cell.

Although the preferred embodiment of the present invention have been disclosed for illustrative purposes, those skilled in the art will appreciate that various modifications, additions and substitutions are possible, without departing from the scope and spirit of the invention as recited in the accompanying claims.

What is claimed is:

1. A circuit for sensing a memory having a plurality of threshold voltages, comprising:

a first current mirror having a first electrode coupled for receiving a first voltage, and a second electrode for coupling to the memory and providing an output at a first node;

a first voltage-matched circuit having a first electrode coupled to said first current mirror at the first node and a second electrode coupled for receiving a second voltage;

a second voltage-matched circuit having a first electrode coupled to said first current mirror at the first node and a second electrode coupled for receiving a third voltage, wherein the first, second and third voltages are different voltages;

a comparator circuit for comparing a voltage at a node commonly connected with said first current mirror and said first and second voltage-matched circuits with a reference voltage; and a decoding logic circuit for decoding an output signal from said comparator circuit and outputting a decoded signal.

2. The circuit of claim 1, wherein:

said first voltage-matched circuit generates first voltage distributions; and said second voltage-matched circuit generates second voltage distributions, wherein the second voltage distributions are offset from the first voltage distributions by a prescribed offset voltage.

3. The circuit of claim 1, wherein the reference voltage has an intermediate value of a distance between voltage distributions varied by said first and second voltage-matched circuits.

4. The circuit of claim 1, wherein the first voltage is a source voltage, the second voltage is a ground voltage, and the third voltage is a voltage between the source and ground voltages.

5. The circuit of claim 2, wherein the third voltage equals the offset voltage.

6. The circuit of claim 2, wherein the prescribed offset voltage equals one-half of a distance between voltages in the first voltage distributions.

7. The circuit of claim 1, wherein said comparator circuit comprises a plurality of comparators, each having a first input electrode and a second input electrode, wherein the first input electrode of each comparator is coupled to the first node, and the second input electrode of each comparator is coupled for receiving the reference voltage.

8. The circuit of claim 1, wherein each of said first and second voltage-matched circuits comprises:

a second current mirror coupled for receiving a reference current from said first current mirror; and a plurality of quantizing circuits, each providing a prescribed voltage distribution and coupled to said second current mirror.

9. The circuit of claim 8, wherein said second current mirror includes first and second transistors, a control electrode of the first and second transistors being coupled to a first electrode of the first transistor, a second electrode of the first transistor is coupled to a second node receiving one of the second and third voltages, and a first electrode of the second transistor is coupled to the second node.

10. The circuit of claim 9, wherein said plurality of quantizing voltage circuits includes a first quantizing circuit for providing a first voltage distribution, said first quantizing circuit having third and fourth transistors and each having a control electrode and first and second electrodes, wherein the first electrode and the control electrode of the fourth transistor are coupled to a second electrode of the second transistor at an output node, the second electrode of the fourth transistor is coupled to the second electrode of the third transistor, the control electrode of the third transistor is coupled to the control electrode of the second transistor, and the first electrode of the third transistor is coupled to the second node.

11. The circuit of claim 10, wherein said plurality of quantizing voltage circuits further includes a second quantizing circuit for providing a second voltage distribution, said second quantizing circuit comprising fifth and sixth transistors and each having a control electrode and first and second electrodes, wherein the first electrode of the sixth transistor is coupled to the output node, the control electrode of the sixth transistor is coupled to the second electrodes of the third and fourth transistors, the second electrode of the sixth transistor is coupled to the second electrode of the fifth transistor, the control electrode of the fifth transistor is coupled to the control electrode of the third transistor, and the first electrode of the fifth transistor is coupled to the second node.

12. The circuit of claim 11, wherein said plurality of quantizing voltage circuits further includes a third quantizing circuit for providing a third voltage distribution, said third quantizing circuit comprising seventh and eighth transistors and each having a control electrode and first and second electrodes, wherein the first electrode of the eighth transistor is coupled to the output node, the control electrode of the eighth transistor is coupled to the second electrodes of the fifth and sixth transistors, the second electrode of the eighth transistor is coupled to the second electrode of the seventh transistor, the control electrode of the seventh transistor is coupled to the control electrode of the fifth transistor, and the first electrode of the seventh transistor is coupled to the second node.

13. The circuit of claim 12, wherein said first, second, third, fourth, fifth, sixth, seventh and eighth transistors are NMOS transistors, the control electrode of each transistor is a gate, the first electrode of each transistor is a drain, and the second electrode of each transistor is a source.

14. A memory sensing device, comprising:

a current mirror coupled for receiving an input from a memory;

a plurality of voltage-matched circuits for generating a respective plurality of voltage distributions, each having a first electrode coupled for receiving a reference current from said current mirror and a second electrode coupled for receiving one of a plurality of voltages, wherein each of the plurality of voltages is different;

a logic circuit coupled for receiving an output from said plurality of voltage-matched circuits to provide a decoded signal; and a reference voltage distributor for generating a reference voltage to said logic circuit.

15. The device of claim 14, wherein said plurality of voltage-matched circuits comprises a first voltage-matched circuit and a second voltage-matched circuit.

16. The device of claim 15, wherein the second electrode of the first voltage-matched circuit is coupled for receiving a first voltage, and wherein the second electrode of the second voltage-matched circuit is coupled for receiving a second voltage, wherein the first and second voltages are different.

17. The device of claim 16, wherein the second voltage equals an offset voltage.

18. The device of claim 17, wherein the first voltage-matched circuit generates a first voltage distribution and the second voltage-matched circuit generates a second voltage distribution, the second voltage distribution being offset from the first voltage distribution by the offset voltage.

19. The device of claim 18, wherein said logic circuit comprises a plurality of comparators, each having a first electrode coupled to the first electrode of said first and second voltage-matched circuits and a second electrode coupled to said reference voltage distributor to receive the reference voltage, and coupled to a decoder circuit for receiving the output of the plurality of comparators and generating a decoded signal.

\* \* \* \* \*